United States Patent
Passamani

(10) Patent No.: US 11,496,147 B2
(45) Date of Patent: Nov. 8, 2022

(54) FRACTAL DIGITAL TO ANALOG CONVERTER SYSTEMS AND METHODS

(71) Applicant: Apple Inc., Cupertino, CA (US)

(72) Inventor: Antonio Passamani, Munich (DE)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/031,443

(22) Filed: Sep. 24, 2020

(65) Prior Publication Data

US 2022/0094368 A1    Mar. 24, 2022

(51) Int. Cl.
*H03M 1/74* (2006.01)
*H04B 1/04* (2006.01)

(52) U.S. Cl.
CPC ............. *H03M 1/74* (2013.01); *H04B 1/04* (2013.01)

(58) Field of Classification Search
CPC ........ H03M 1/747; H03M 1/685; H03M 1/66; H03M 1/687; H03M 1/742; H03M 1/745; H03M 1/662; H03M 1/0648; H03M 1/0863; H03M 1/68; H03M 1/804; H03M 1/0673; H03M 1/1061; H03M 1/802; H03M 1/0624; H03M 1/20; H03M 1/468; H03M 1/0612; H03M 1/0836; H03M 1/682; H03M 1/74; H03M 1/765; H03M 1/785; H03M 3/502; H03M 1/00; H03M 1/06; H03M 1/0651; H03M 1/067; H03M 1/068; H03M 1/1014; H03M 1/1085; H03M 1/12; H03M 1/162; H03M 1/164; H03M 1/168; H03M 1/806; H03M 3/30; H03M 3/378; H04B 1/04; H04B 1/0007; H04B 1/28; H04B 1/40; H04B 2001/0408; H04B 2001/0491; H04B 1/0475; H04B 1/401; H04B 1/403
See application file for complete search history.

(56) References Cited

U.S. PATENT DOCUMENTS

| | | | |
|---|---|---|---|
| 8,872,686 B2 | 10/2014 | Chou et al. | |
| 9,220,180 B2 | 12/2015 | Dunn, Jr. | |
| 2003/0001766 A1* | 1/2003 | Song | H03M 1/687 341/145 |
| 2006/0285094 A1* | 12/2006 | Reijnen | G03F 7/70291 355/53 |
| 2016/0173269 A1* | 6/2016 | Kuttner | H03M 1/66 375/347 |
| 2019/0335118 A1* | 10/2019 | Simolon | H04N 5/33 |
| 2021/0250038 A1* | 8/2021 | Tangirala | H03M 1/442 |

FOREIGN PATENT DOCUMENTS

| | | |
|---|---|---|
| CN | 103368576 B | 5/2016 |
| WO | 2020186255 A1 | 9/2020 |

\* cited by examiner

*Primary Examiner* — Golam Sorowar
(74) *Attorney, Agent, or Firm* — Fletcher Yoder P.C.

(57) ABSTRACT

An electronic device may include digital circuitry to operate via digital signals and analog circuitry to operate via analog signals. The electronic device may also include a fractal digital to analog converter (DAC) to convert a digital signal into an analog signal. The fractal DAC may include a unit cell array having a branching data path and multiple unit cells disposed in a fractal pattern. The fractal DAC may also include multiple decision units disposed within the unit cell array on the branching data path. Each decision unit may receive an incoming signal representative of at least a portion of the digital signal and direct each decision unit output to different branches of the unit cell array. The unit cells may be enabled based at least in part on the decision unit outputs to generate the analog signal.

25 Claims, 11 Drawing Sheets

FRACTAL DIGITAL TO ANALOG CONVERTER SYSTEMS AND METHODS

BACKGROUND

This disclosure generally relates to digital to analog converters (DACs).

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Numerous electronic devices—including televisions, portable phones, computers, wearable devices, vehicle dashboards, virtual-reality glasses, and more—utilize DACs to generate analog electrical signals from digitally coded data. For example, an electronic device may use one or more DACs to convert digital signals to analog signals for transmission via radio frequency (RF) circuitry. Additionally or alternatively, DACs may be used to drive pixels of an electronic display at specific voltages based on digitally coded image data to produce the specific luminance level outputs to display an image. In some scenarios, the physical and/or logical layout of unit cells within a DAC may alter the data path length to each unit cell and/or the number of circuitry components traversed by the digital signal, which may affect the speed of operation of the DAC and/or the linearity of the DAC.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

An electronic device may use one or more digital to analog converters (DACs) to convert digitally coded data (e.g., coded via binary code, grey-code, thermometer code, etc.) to a corresponding analog output voltage. In general, DACs may generate an analog electrical signal by switching on one or more unit cells outputting a unit level current or voltage that, in the aggregate, forms the analog electrical signal. In some scenarios, the physical and/or logical layout of the unit cells may alter the data path length to each unit cell and/or the number of circuitry components traversed by the digital signal, which may affect the speed of operation of the DAC and/or the linearity of the DAC.

In some embodiments, a fractal arrangement of unit cells and/or the transmission lines thereto into branches may assist in unifying the data path length to each of the unit cells, which may result in increased speed (e.g., operating frequency) of the DAC, increased linearity, and/or potential power savings. For example, as opposed to column and line DACs, where the data path to different unit cells may vary, a fractal DAC may have a static path length for the incoming data to each of the unit cells. In other words, each branch of the fractal layout tree may have equal length from the input to the unit cells. As such, there is minimized waiting between moments when unit cells are turned on for a given data value. Additionally, the simplified distribution (e.g., via sequential decision units) of the incoming data to the unit cells may be further simplified by limiting or eliminating gate cells and/or reprocessing or recombining of the data, which may further increase speed capabilities (e.g., operating frequency) and/or linearity (e.g., decreased differential nonlinearity (DNL) and/or integral nonlinearity (INL)) of the DAC. Moreover, due to the sequential nature of the decision units governing the unit cells, some signals (e.g., a clock signal, a phase signal, etc.) may be turned off when it is known that no further unit cells will be needed in a particular branch yielding increased power savings.

Additionally, in some embodiments, the DAC may be coded using thermometer coding. The thermometer coding may facilitate simplified operation of the unit cells by correlating each digit of the string of digital data to one or more unit cells, such that, for example, as the thermometer coded digital data increases in value by 1, one additional unit cell is turned on. Additionally, in some embodiments, thermometer coding may also reduce the likelihood of bit-to-bit skew. As such, a thermometric fractal DAC may facilitate increased speed (e.g., operating frequency) of the DAC, increased linearity (e.g., decreased differential nonlinearity (DNL) and/or integral nonlinearity (INL)), and/or potential power savings.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
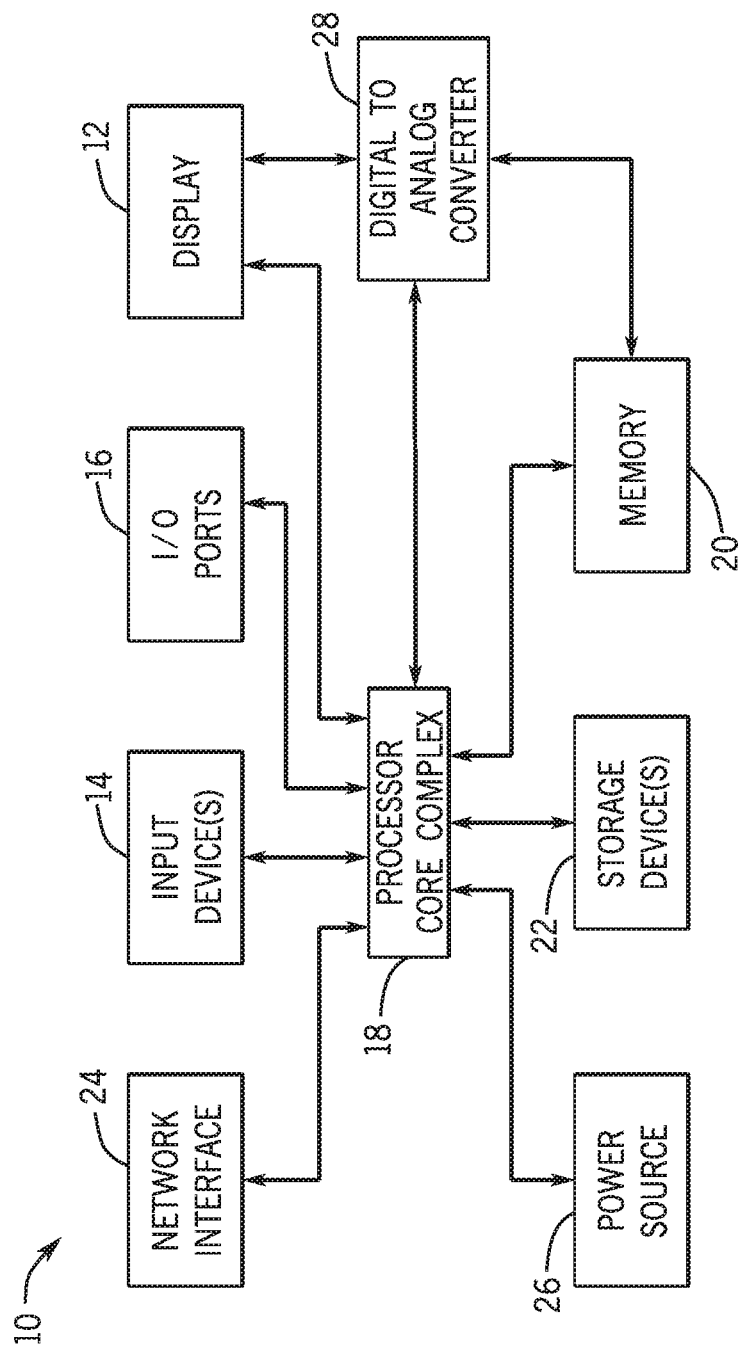
FIG. 1 is a block diagram of an electronic device that includes a digital to analog converter, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

An electronic device may use one or more digital to analog converters (DACs) to convert digitally coded data (e.g., coded via binary code, grey-code, thermometer code, etc.) to a corresponding analog output voltage. In general, DACs may generate an analog electrical signal by switching on one or more unit cells outputting a unit level current or voltage that, in the aggregate, forms the analog electrical signal. In some scenarios, the physical and/or logical layout of the unit cells may alter the data path length to each unit cell and/or the number of circuitry components traversed by the digital signal, which may affect the speed of operation of the DAC and/or the linearity of the DAC.

In general, column and line DACs may use multiple decision units in parallel to decipher, reprocess, and/or combine digital data to control operation of unit cells to generate an analog signal. However, the logical layout of the column and line decision units as well as the physical layout of the column and line unit cells may create varying data path lengths to the unit cells as well as more complicated and/or slower control logic operation than that of a fractal DAC.

In some embodiments, a fractal arrangement of unit cells and/or the transmission lines thereto into branches may assist in unifying the data path length to each of the unit cells, which may result in increased speed (e.g., operating frequency) of the DAC, increased linearity, and/or potential power savings. For example, as opposed to column and line DACs, where the data path to different unit cells may vary, a fractal DAC may have a static path length for the incoming data to each of the unit cells. In other words, each branch of the fractal layout tree may have equal length from the input to the unit cells. As such, there is minimized waiting between moments when unit cells are turned on for a given data value. Additionally, the simplified distribution (e.g., via sequential decision units) of the incoming data to the unit cells may be simplified by limiting or eliminating gate cells and/or reprocessing or recombining of the data, which may further increase speed capabilities (e.g., operating frequency) and/or linearity (e.g., decreased differential nonlinearity (DNL) and/or integral nonlinearity (INL)) of the DAC. Moreover, due to the sequential nature of the decision units governing the unit cells, some signals (e.g., a clock signal, a phase signal, etc.) may be turned off when it is known that no further unit cells will be needed in a particular branch yielding increased power savings.

Additionally, in some embodiments, the DAC may be coded using thermometer coding. The thermometer coding may facilitate simplified operation of the unit cells by correlating each digit of the string of digital data to one or more unit cells, such that, for example, as the thermometer coded digital data increases in value by 1, one additional unit cell is turned on. Additionally, in some embodiments, thermometer coding may also reduce the likelihood of bit-to-bit skew. As such, a thermometric fractal DAC may facilitate increased speed (e.g., operating frequency) of the DAC, increased linearity (e.g., decreased differential nonlinearity (DNL) and/or integral nonlinearity (INL)), and/or potential power savings.

To help illustrate, an electronic device 10, which includes an electronic display 12, is shown in FIG. 1. As will be described in more detail below, the electronic device 10 may be any suitable electronic device 10, such as a computer, a mobile phone, a portable media device, a tablet, a television, a virtual-reality headset, a vehicle dashboard, and the like. Thus, it should be noted that FIG. 1 is merely one example of a particular implementation and is intended to illustrate the types of components that may be present in an electronic device 10.

The electronic device 10 may include one or more electronic displays 12, one or more input devices 14, one or more input/output (I/O) ports 16, a processor core complex 18 having one or more processor(s) or processor cores, local memory 20, a main memory storage device 22, a network interface 24, a power source 26, and one or more digital to analog converters (DACs) 28. The various components described in FIG. 1 may include hardware elements (e.g., circuitry), software elements (e.g., a tangible, non-transitory computer-readable medium storing instructions), or a combination of both hardware and software elements. It should be noted that the various depicted components may be combined into fewer components or separated into additional components. For example, the local memory 20 and the main memory storage device 22 may be included in a single component. Additionally or alternatively, a DAC 28 may be included in the electronic display 12, the network interface 24 and/or other circuitry.

The processor core complex 18 may be operably coupled with local memory 20 and the main memory storage device 22. Thus, the processor core complex 18 may execute instructions stored in local memory 20 and/or the main memory storage device 22 to perform operations, such as generating and/or transmitting image data. As such, the processor core complex 18 may include one or more general purpose microprocessors, one or more application specific integrated circuits (ASICs), one or more field programmable logic arrays (FPGAs), or any combination thereof.

In addition to instructions, the local memory 20 and/or the main memory storage device 22 may store data to be processed by the processor core complex 18. Thus, in some embodiments, the local memory 20 and/or the main memory storage device 22 may include one or more tangible, non-transitory, computer-readable mediums. For example, the local memory 20 may include random access memory (RAM) and the main memory storage device 22 may include read only memory (ROM), rewritable non-volatile memory such as flash memory, hard drives, optical discs, and/or the like.

The processor core complex 18 is also operably coupled with the network interface 24. In some embodiments, the network interface 24 may facilitate data communication with another electronic device and/or a communication network. For example, the network interface 24 (e.g., a radio frequency (RF) system) may enable the electronic device 10 to communicatively couple to a personal area network (PAN), such as a Bluetooth network, a local area network (LAN), such as an 802.11x Wi-Fi network, a mmWave network, and/or a wide area network (WAN), such as a 4G or LTE cellular network. In some embodiments, the network interface 24 may utilize one or more DACs 28 to generate analog signals for transmission via an RF system. For example, the DAC 28 may generate analog signals from digital data to provide transmission signals that may be amplified and transmitted (e.g., via one or more antennas).

The power source 26 may provide electrical power to one or more components in the electronic device 10, such as the processor core complex 18, the electronic display 12, and/or the DAC 28. Thus, the power source 26 may include any suitable source of energy, such as a rechargeable lithium polymer (Li-poly) battery and/or an alternating current (AC) power converter. I/O ports 16 may enable the electronic device 10 to interface with other electronic devices. For example, when a portable storage device is connected, the I/O port 16 may enable the processor core complex 18 to communicate data with the portable storage device.

The input devices 14 may facilitate user interaction with the electronic device 10 by receiving user inputs. Thus, an input device 14 may include a button, a keyboard, a mouse, a trackpad, and/or the like. An input device 14 may include touch-sensing components in the electronic display 12. In such embodiments, the touch sensing components may receive user inputs by detecting occurrence and/or position of an object touching the surface of the electronic display 12.

The electronic display 12 may control light emission from its display pixels (e.g., via one or more DACs 28) to present visual representations of information, such as a graphical user interface (GUI) of an operating system, an application interface, a still image, or video content, by displaying frames based at least in part on corresponding image data (e.g., image pixel data corresponding to individual pixel positions). The electronic display 12 may take the form of a liquid crystal display (LCD), a light emitting diode (LED) display, an organic light emitting diode (OLED) display, a plasma display, or the like.

The electronic display 12 may display images based at least in part on image data received from an image data source, such as the processor core complex 18 and/or the network interface 24, an input device 14, and/or an I/O port 16. The image data source may generate source image data to create a digital representation of the image to be displayed. In other words, the image data is generated such that the image view on the electronic display 12 accurately represents the intended image. Image data may be processed before being supplied to the electronic display 12, for example, via a display pipeline implemented in the processor core complex 18 and/or image processing circuitry.

The display pipeline may perform various processing operations, such as spatial dithering, temporal dithering, pixel color-space conversion, luminance determination, luminance optimization, image scaling, and/or the like. Based on the image data from the image data source and/or processed image data from the display pipeline, target luminance values for each display pixel may be determined. Moreover, the target luminance values may be mapped to analog voltage values (e.g., generated via one or more DACs 28), and the analog voltage value corresponding to the target luminance for a display pixel at a particular location may be applied to that display pixel to facilitate the desired luminance output from the display. For example, a first display pixel desired to be at a lower luminance output may have a lower voltage applied than a second display pixel desired to be at a higher luminance output.

Figure 2:
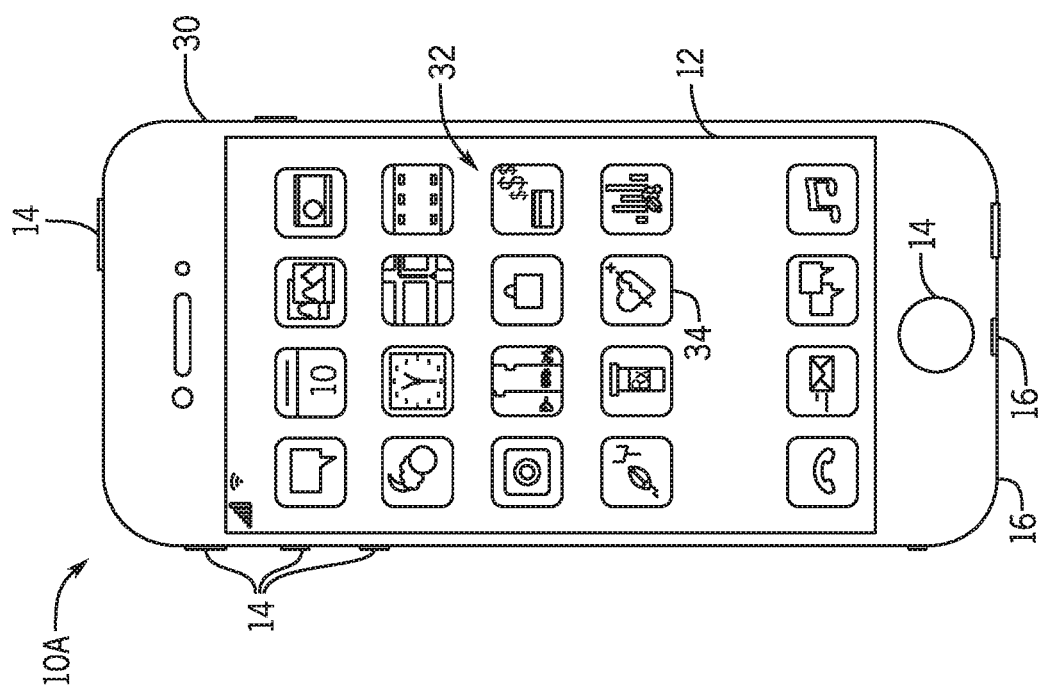
FIG. 2 is an example of the electronic device of FIG. 1, in accordance with an embodiment.

As described above, the electronic device 10 may be any suitable electronic device. To help illustrate, one example of a suitable electronic device 10, specifically a handheld device 10A, is shown in FIG. 2. In some embodiments, the handheld device 10A may be a portable phone, a media player, a personal data organizer, a handheld game platform, and/or the like. For illustrative purposes, the handheld device 10A may be a smart phone, such as any iPhone® model available from Apple Inc.

The handheld device 10A includes an enclosure 30 (e.g., housing). The enclosure 30 may protect interior components from physical damage and/or shield them from electromagnetic interference. The enclosure 30 surround the electronic display 12. In the depicted embodiment, the electronic display 12 is displaying a graphical user interface (GUI) 32 having an array of icons 34. By way of example, when an icon 34 is selected either by an input device 14 or a touch-sensing component of the electronic display 12, an application program may launch.

Input devices 14 may be accessed through openings in the enclosure 30. As described above, the input devices 14 may enable a user to interact with the handheld device 10A. For example, the input devices 14 may enable the user to activate or deactivate the handheld device 10A, navigate a user interface to a home screen, navigate a user interface to a user-configurable application screen, activate a voice-recognition feature, provide volume control, and/or toggle between vibrate and ring modes. The I/O ports 16 may be accessed through openings in the enclosure 30. The I/O ports 16 may include, for example, an audio jack to connect to external devices.

Figure 3:
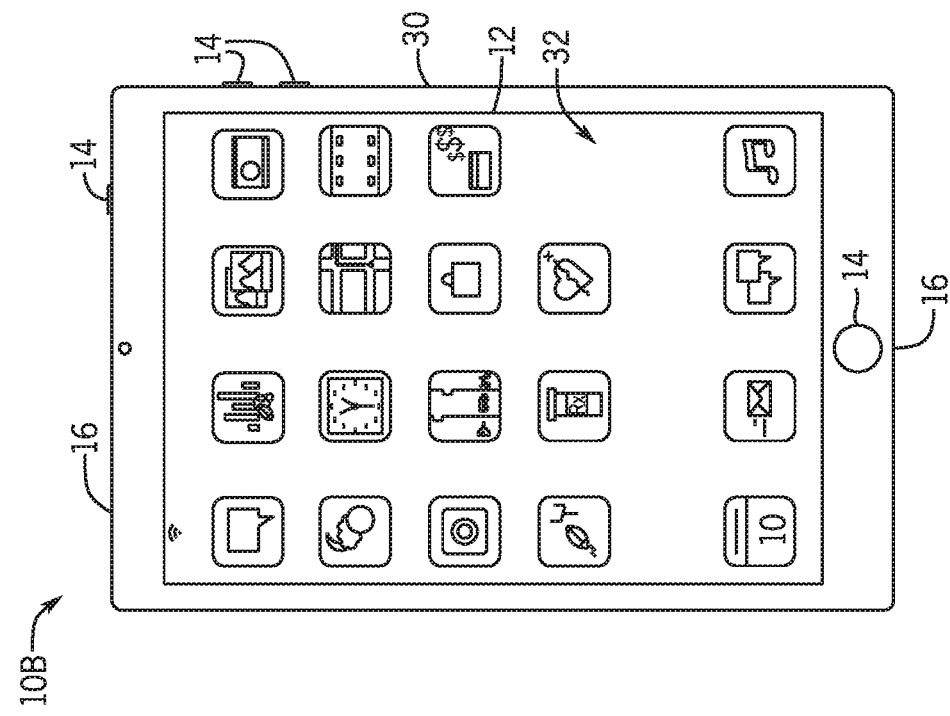
FIG. 3 is another example of the electronic device of FIG. 1, in accordance with an embodiment.
Figure 4:
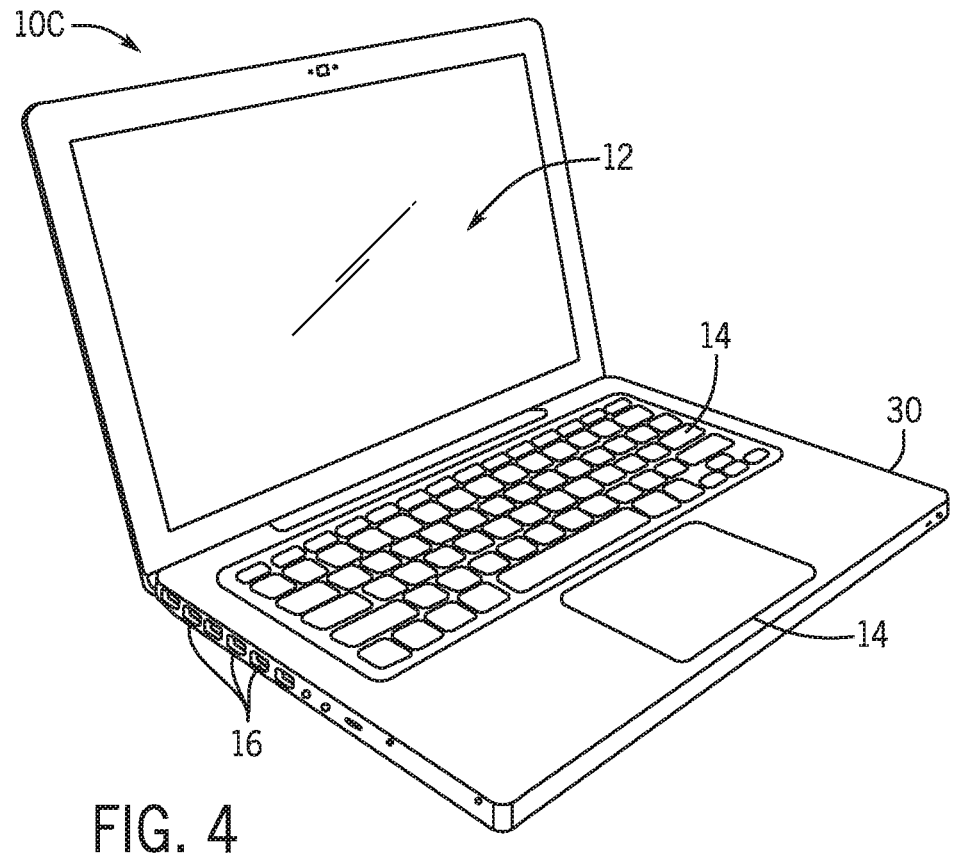
FIG. 4 is another example of the electronic device of FIG. 1, in accordance with an embodiment.
Figure 5:
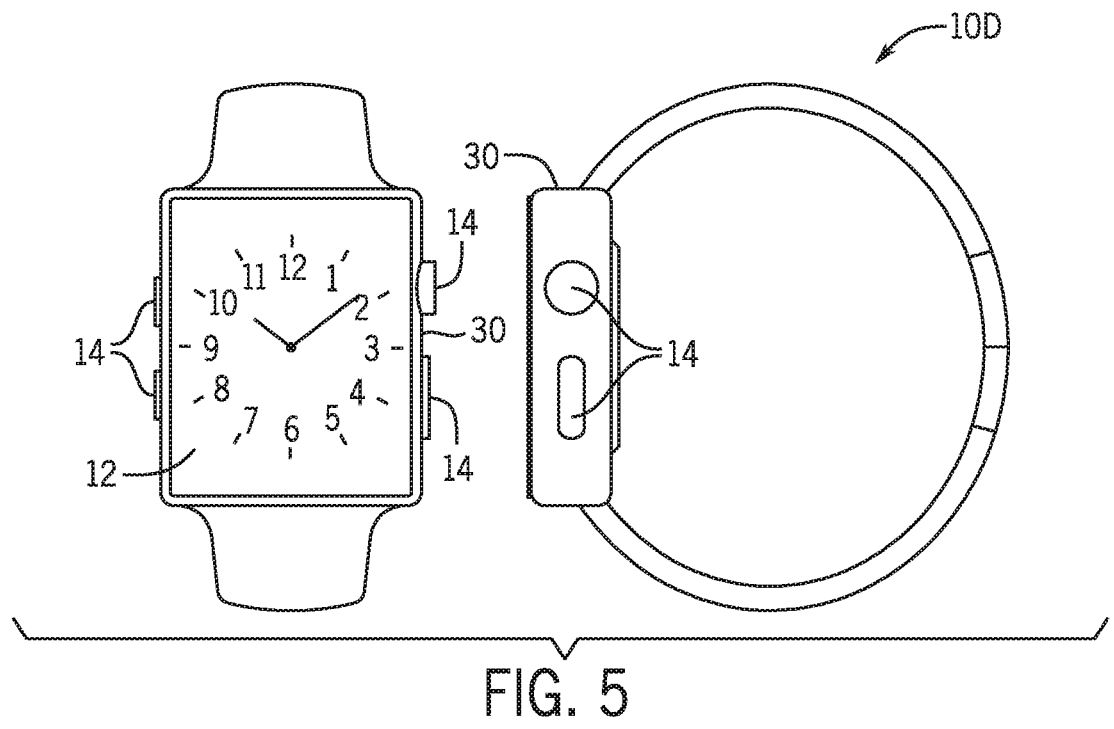
FIG. 5 is another example of the electronic device of FIG. 1, in accordance with an embodiment.

Another example of a suitable electronic device 10, specifically a tablet device 10B, is shown in FIG. 3. For illustrative purposes, the tablet device 10B may be any iPad® model available from Apple Inc. A further example of a suitable electronic device 10, specifically a computer 10C, is shown in FIG. 4. For illustrative purposes, the computer 10C may be any Macbook® or iMac® model available from Apple Inc. Another example of a suitable electronic device 10, specifically a watch 10D, is shown in FIG. 5. For illustrative purposes, the watch 10D may be any Apple Watch® model available from Apple Inc. As depicted, the tablet device 10B, the computer 10C, and the watch 10D each also includes an electronic display 12, input devices 14, I/O ports 16, and an enclosure 30.

As described above, an electronic device 10 may utilize a DAC 28 to generate analog output signals from digital signals. For example, the DAC 28 may be used to generate analog signals for transmission via the network interface 24 (e.g., an RF system), to generate analog output signals for display pixels to facilitate illumination at a target luminance, and/or elsewhere in the electronic device. To help illustrate, FIGS. 6 and 7 include potential uses for a DAC 28 in an electronic device 10. As should be appreciated, although the DACs 28 are illustrated as part of a gamma bus 36 in FIG. 6 and as part of the network interface 24 in FIG. 7, these are provided as a non-limiting examples, and the techniques disclosed herein may be applied to DACs 28 in any suitable implementation.

Figure 6:
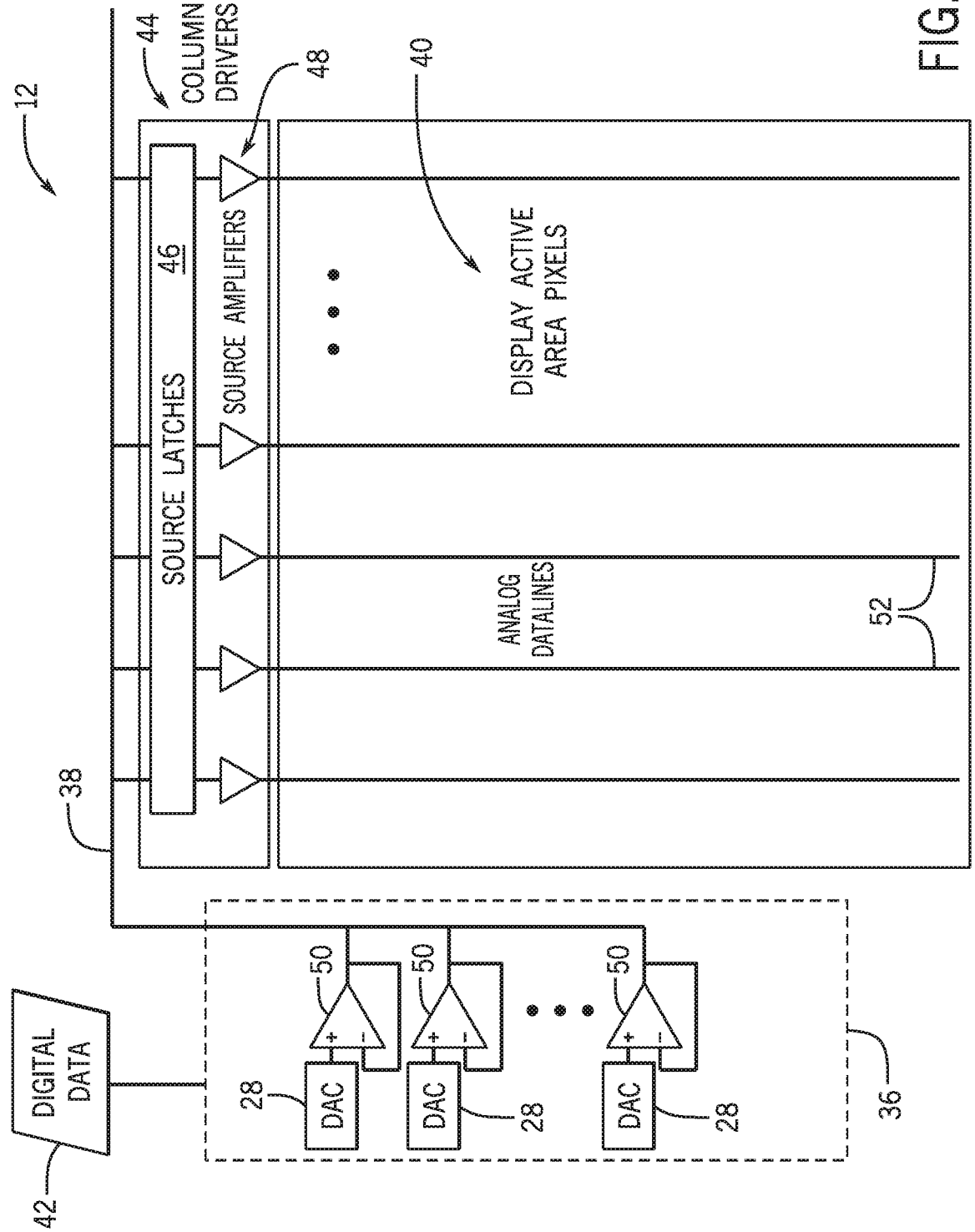
FIG. 6 is a diagrammatic representation of a digital to analog converter in conjunction with an electronic display, in accordance with an embodiment.

A schematic diagram of a portion of the electronic device 10, including a gamma bus 36 with multiple DACs 28 and the electronic display 12, is shown in FIG. 6. In some embodiments, the electronic display 12 may use the analog output voltages 38 of a DAC 28 to power display pixels 40 at various voltages that correspond to different luminance levels. For example, digital data 42 (e.g., digital image data) may correspond to original or processed image data and contain target luminance values for each display pixel 40 in an active area of the electronic display 12. Moreover, display circuitry, such as the column drivers 44, also known as data drivers and/or display drivers, may include source latches 46, source amplifiers 48, and/or any other suitable logic/circuitry to select the appropriate analog voltage and apply power at that voltage to the display pixel 40 to achieve the target luminance output from the display pixel 40.

In some embodiments, power at the output voltage 38 of the DAC 28 may be buffered by one or more buffers 50 (e.g., operational amplifiers) to reduce and/or stabilize the current draw on the output of the DAC 28. Moreover, in some embodiments, the DAC 28 may output a negative voltage relative to a reference point (e.g., ground). In the illustrated example, the buffered output voltage 38 travels down analog datalines 52 to display pixels 40 of the active area.

Figure 7:
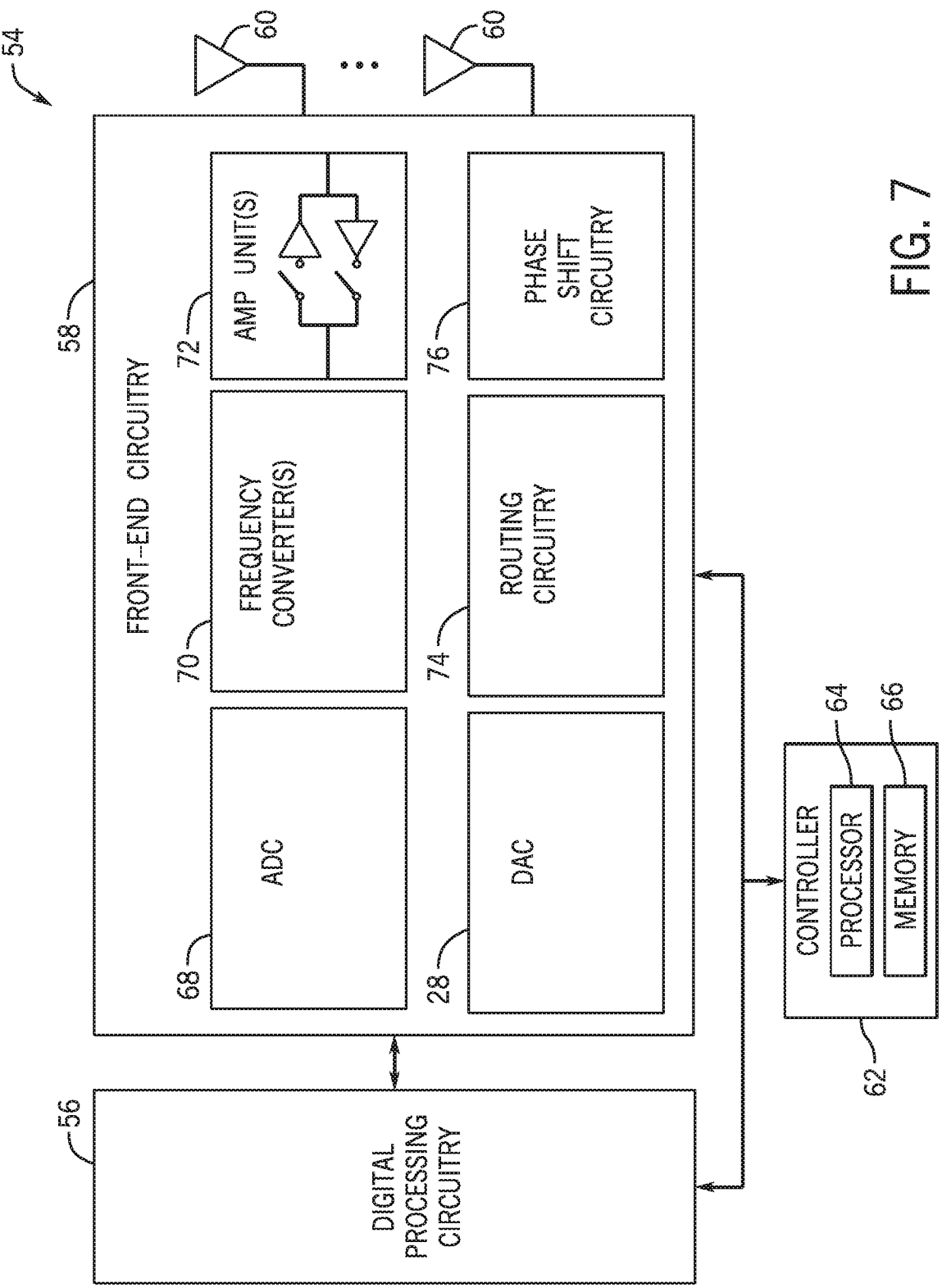
FIG. 7 is a diagrammatic representation of a digital to analog converter in conjunction with front-end circuitry, in accordance with an embodiment.

Additionally or alternatively, the electronic device 10 may utilize a DAC 28 as part of the network interface 24 (e.g., a RF system 54), as shown in FIG. 7. As described above, a radio frequency system 54 may facilitate wirelessly communicating data with other electronic devices and/or a communication network. As in the depicted example, an RF system 54 may include digital processing circuitry 56, front-end circuitry 58, one or more antennas 60, and a controller 62. It should be appreciated that the depicted example is merely intended to be illustrative and not limiting. For example, in other embodiments, a RF system 54 may include a single antenna 60 or more than two antennas 60.

The controller 62 may generally control operation of the RF system 54. Although depicted as a single controller 62, in other embodiments, one or more separate controllers 62 may be used to control operation of the RF system 54. To facilitate controlling operation, the controller 62 may include one or more controller processors 64 and/or controller memory 66. In some embodiments, a controller processor 64 may execute instructions and/or process data stored in the controller memory 66 to determine control commands that instruct the RF system 54 to perform a control action. Additionally or alternatively, a controller processor 64 may be hardwired with instructions that determine control commands when executed. Furthermore, in some embodiments, a controller processor 64 may be included in the processor core complex 18, separate processing circuitry, or both, and the controller memory 66 may be included in local memory 20, a main memory storage device 22, another tangible, non-transitory computer-readable medium, or any combination thereof.

Digital processing circuitry 56 implemented in a RF system 54 may generally operate in a digital domain. In other words, the digital processing circuitry 56 may process data indicated via digital electrical signals, for example, which indicate a "0" bit when the voltage is below a voltage threshold and a "1" bit when the voltage is above the voltage threshold. In some embodiments, the digital processing circuitry 56 may include a modem, a baseband processor, and/or the like. Additionally, in some embodiments, the digital processing circuitry 56 may be communicatively coupled to the processor core complex 18 to enable the electronic device 10 to wirelessly transmit data and/or receive wirelessly transmitted data via the RF system 54.

On the other hand, antennas 60 implemented in a RF system 54 generally operate in an analog domain. For example, an antenna 60 may facilitate wireless data transmission by modulating electromagnetic (e.g., radio) waves based at least in part on an analog electrical signal received from the front-end circuitry 58. Additionally or alternatively, an antenna 60 may facilitate wireless data reception by outputting an analog electrical signal based at least in part on received (e.g., incident) electromagnetic waves.

In the depicted example, the front-end circuitry 58 may be coupled between the digital processing circuitry 56 and the antennas 60 and, thus, operate as an interface between the digital domain and the analog domain. Thus, the front-end circuitry 58 may include an analog-to-digital converter (ADC) 68 that operates to convert an analog electrical signal (e.g., output from an antenna 60) into a digital electrical signal (e.g., to be output to the digital processing circuitry 56). Additionally, the front-end circuitry 58 may include a digital-to-analog converter (DAC) 28 that converts a digital electrical signal (e.g., output from the digital processing circuitry 56) into an analog electrical signal (e.g., to be output to an antenna 60). Moreover, the front-end circuitry 58 may be implemented across multiple integrated circuits (e.g., devices or chips). For example, the analog-to-digital converter 68 and/or the DAC 28 may be implemented in a transceiver integrated circuit.

In addition to the analog-to-digital converter 68 and the DAC 28, as in the depicted example, the front-end circuitry 58 may include one or more frequency converters 70, one or more amplifier units 72, and routing circuitry 74. In some embodiments, the RF system 54 may also include phase shift circuitry 76, for example, to facilitate implementing beam forming techniques.

Figure 8:
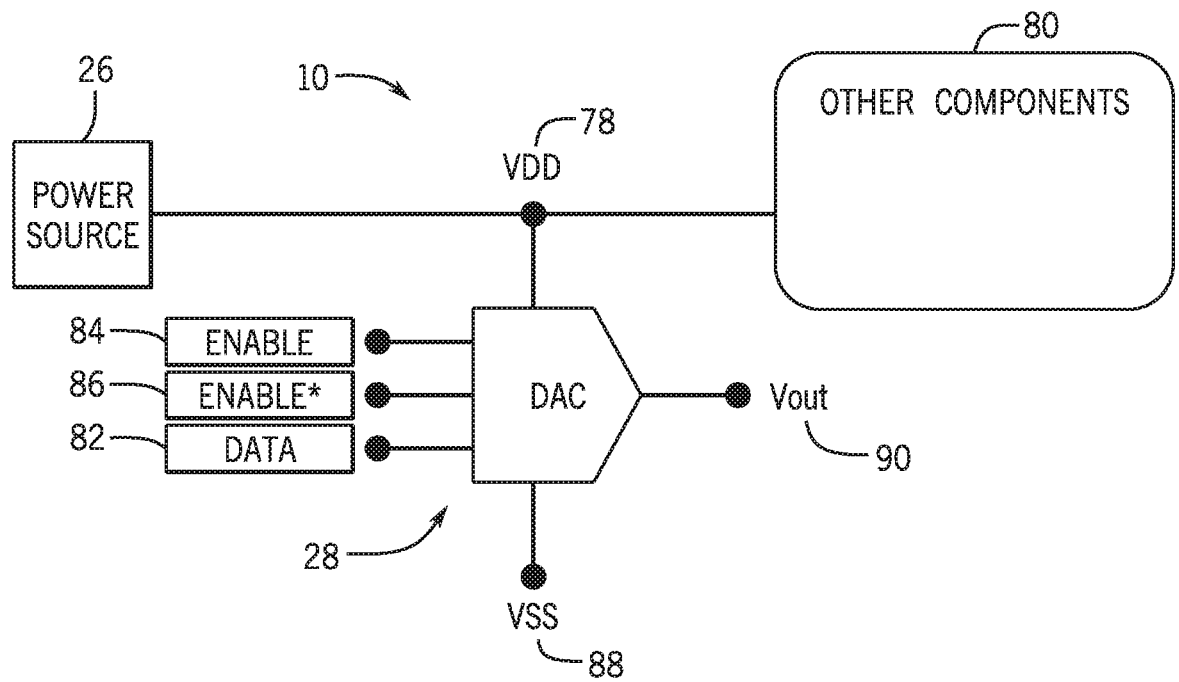
FIG. 8 is a diagrammatic representation a digital to analog converter and other components of an electronic device, in accordance with an embodiment.

FIG. 8 is a diagrammatical view of a DAC 28 of an electronic device 10 in an example environment of the electronic device 10. In some embodiments, the DAC 28 may share a supply voltage (e.g., VDD) 78 with other components 80 of the electronic device 10. For example, the other components 80 may include any powered electronic component of the electronic device 10 operating at or utilizing the supply voltage 78 or a derivative thereof. Moreover, the DAC 28 may receive the digital signal 82 and/or an enable signal 84 and/or a complimentary enable signal 86. The enable signal 84 and/or it's the complimentary enable signal 86, may be provided to enable operation of the DAC 28. For example, if the enable signal 84 is logically "low," relative to a reference voltage 88 (e.g., ground or other relative voltage) the DAC 28 may be disabled. On the other hand, if the enable signal 84 is logically "high," (e.g., relative to the reference voltage 88 and/or the supply voltage 78) the DAC 28 may be enabled for operation. Furthermore, the reference voltage 88 (e.g., VSS) may be provided as a reference for the digital signal 82, the enable signal 84, the complimentary enable signal 86, the supply voltage 78, the analog output signal 90, or a combination thereof. As should be appreciated, as used herein, signals (e.g., digital signal 82, enable signal 84, complimentary enable signal 86, analog output signal 90, etc.) may correspond to voltages or currents relative to a reference and may represent electronically storable, displayable, and/or transmittable data.

As discussed above, the different analog output signals 90 generated by the DACs 28 may correspond to the values of the digital signal 82. The digital signal 82 and corresponding analog output signal 90 may be associated with any suitable bit-depth depending on implementation. For example, in the context of image data and/or signal transmission data, 8-bit digital signal 82 may correspond to 256 different analog reference voltages.

Figure 9:
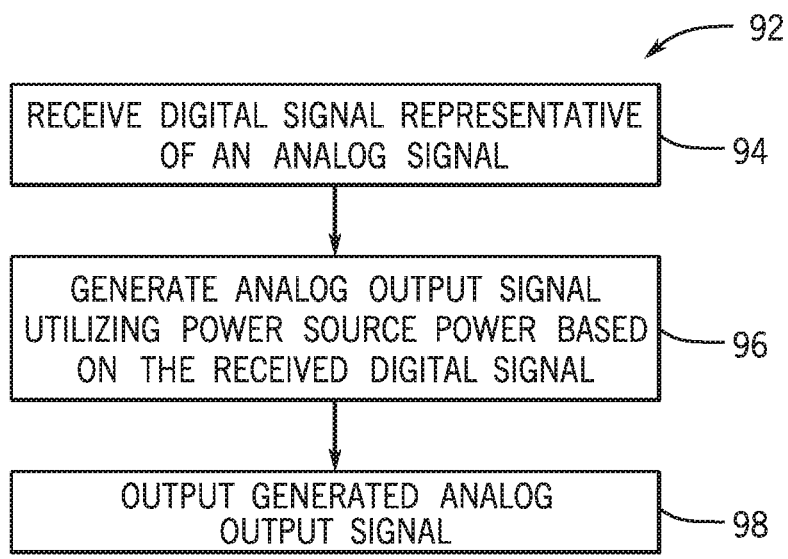
FIG. 9 is a flowchart of an example operation of a digital to analog converter, in accordance with an embodiment.

FIG. 9 is a flowchart 92 for an example operation of the DAC 28. The DAC 28 may receive digital signal 82 representative of an analog signal (process block 94). The DAC 28 may also generate an analog output signal 90, utilizing power from the power source 26, based on the received digital signal 82 (process block 96). The generated analog output signal 90 can then be output from the DAC 28 (processing block 98).

As discussed above, DACs 28 may generate an analog output signal 90 by enabling one or more unit cells to output a unit level current or voltage that, in the aggregate, forms the analog output signal 90. The unit level current or voltage may be predetermined and based on implementation factors. In some scenarios, the physical and/or logical layout of the unit cells may affect the speed of operation of the DAC and/or the linearity of the DAC. As such, in some embodiments, one or more DACs 28 of the electronic device 10 may be implemented as a fractal DAC 100, as exampled in FIG. 10. In some embodiments, a fractal DAC 100 may include multiple unit cells 102 arranged (e.g., logically and/or physically) in a fractal pattern constructed of fractal blocks 104. For example, the pattern may be replicated (e.g., to increase the size of the fractal DAC 100) by replacing each unit cell 102 with a fractal block 104, maintaining symmetry. In the illustrated example, the fractal DAC 100 includes sixteen fractal blocks 104 of four unit cells 102, which may correspond to, for example, sixty-four different (non-zero) analog output signals 90. However, larger fractal DACs 100 may be envisioned by replacing each unit cell 102 with a fractal block 104, increasing the size of the fractal DAC 100 by four each time to maintain 4× unit cells 102. As should be appreciated, the size of the fractal DAC 100 may depend on implementation factors such as desired granularity of the analog output signal 90. Furthermore, different size fractal blocks 104 (e.g., half a fractal block 104) may be used to achieve different numbers of total unit cells 102 (e.g., $2^x$ number of unit cells 102 for fractal blocks 104 of size two unit cells 102). Moreover, in some embodiments, one or more unit cells 102 may be representative of fractional unit cells (e.g., outputting 0.5 or 0.25 of a unit voltage or current) to further increase granularity, dynamic range extension, and/or as an offset to decrease differential nonlinearity (DNL) and/or integral nonlinearity (INL).

In some embodiments, the multiple nested fractal blocks 104 may be continuously split into symmetric branches by decision units 106 (e.g., 106A, 106B, 106C, 106D, etc.) until reaching the unit cells 102. For a given branch of the fractal DAC 100, sequential decision units 106 may be used to interpret the digital signal 82 and direct enable/disable signals to the corresponding unit cells 102 to generate the analog output signal 90. Additionally, although the digital signal 82 is depicted as a single line, in some embodiments, the digital signal 82 may include multiple data buses running in parallel through the fractal DAC 100. For example, the multiple data buses may include data for multiple phases and/or polarity (e.g., negative and positive). As such, the fractal DAC 100 and the decision units 106 may operate on multiple digital signals 82 in parallel to control outputs of the unit cells 102.

Figure 11:
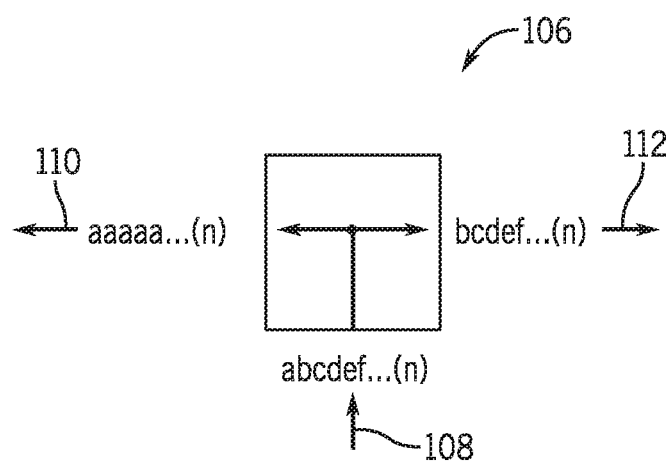
FIG. 11 is a diagrammatic representation of a decision unit of the fractal digital to analog converter of FIG. 10, in accordance with an embodiment.

To help illustrate, FIG. 11 is an example decision unit 106 receiving an incoming signal 108 of n bits. In some embodiments the incoming signal 108 (e.g., digital signal 82) is a binary signal that is decoded step-by-step by the decision units 106 such that the aggregate of the signals reaching the unit cells 102 forms a thermometric signal. For example, the aggregate thermometric signal for a binary incoming signal 108 of "10" may be represented as "0011." As the decision units 106 decipher and pass on certain portions of the incoming signal 108 along different routes, the unit cells 102 may eventually end up with respective portions of the a thermometric digital signal (e.g., with logical "1" going to two unit cells 102 for activation and logical "0" going to two different unit cells for deactivation). For example, the incoming signal 108 may have n-bits (e.g., abcdef . . . , where each letter is representative of a logical value in a binary format, as in the illustrated example). Each decision unit 106 may take the most significant bit (MSb) of the incoming signal 108, repeat it n−1 times, and output a MSb signal 110 having the MSb of the incoming signal 108 repeated n−1 times. Additionally, the decision unit 106 may output a least significant bit (LSb) signal 112 including the remainder of the incoming signal 108, without the MSb, having n−1 total bits. As should be appreciated, the MSb of a binary signal is representative of half of the value of the incoming signal 108. As such, if the MSb (e.g., at decision unit 106A) is a logical "1", the repeated logical "1" will be propagated down half of the branches of the fractal DAC 100, reducing the bit-depth by one with each subsequent decision unit 106, to enable half of the unit cells 102 downstream from the initial decision unit 106 (e.g., decision unit 106A). The remaining half of the unit cells 102 may be enabled or disabled according to the LSb signal 112 having the remainder of the incoming signal 108. Using similar logic, the LSb signal 112 from an initial decision unit 106 (e.g., decision unit 106A) may be the incoming signal 108 for a subsequent decision unit 106 (e.g., decision unit 106B) and so forth.

Figure 10:
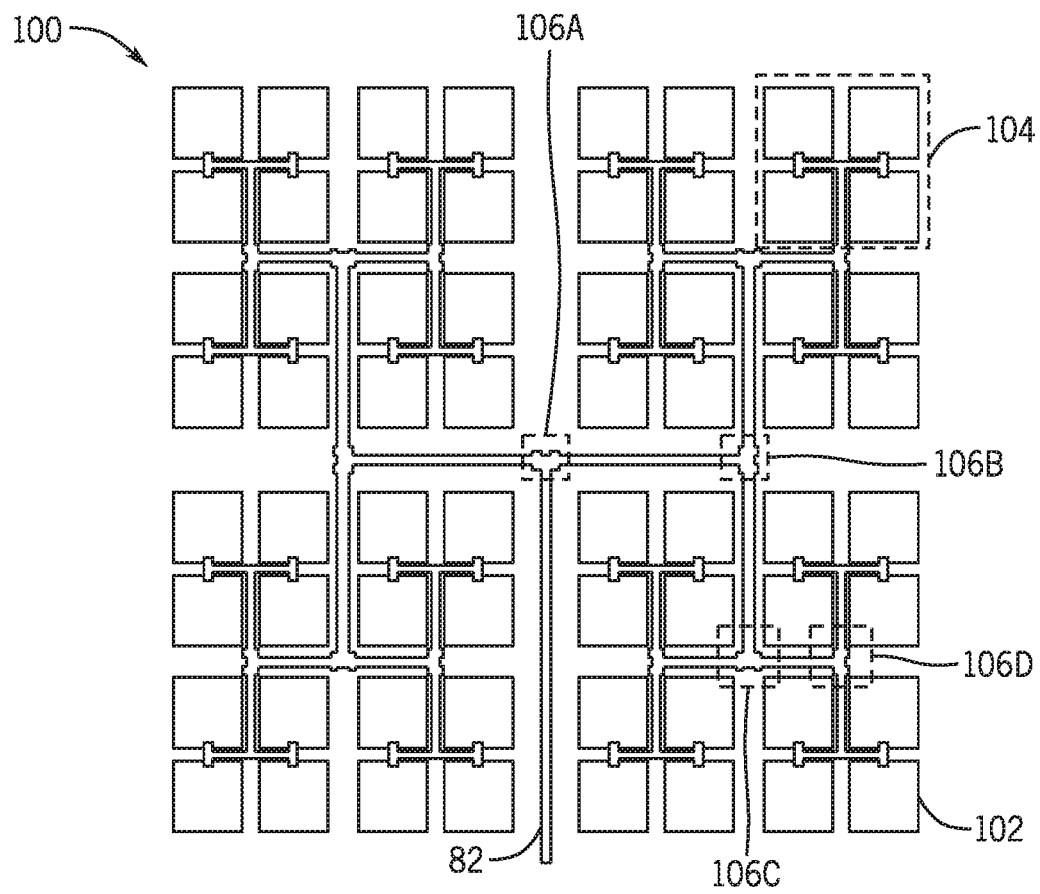
FIG. 10 is a diagrammatic representation of a fractal digital to analog converter, in accordance with an embodiment.

Additionally, although depicted in FIGS. 10 and 11 as having two outputs (e.g., MSb signal 110 and LSb signal 112), in some embodiments, the decision units 106 may evaluate multiple bits of the incoming signal 108 at the same time. For example, a decision unit 106 may provide four outputs in a quaternary split of the incoming signal 108, effectively combining the efforts of the first two levels of decision units 106 (e.g., decision unit 106A, decision unit 106B, and the decision unit opposite decision unit 106B). In the example of the quaternary split, two outputs may include the MSb signal 110 with a bit depth of n−2, a signal of repeated entries of the second MSb with a bit depth of n−2, and the LSb signal 112 with a bit depth of n−2, having the 2 MSbs removed. As should be appreciated, the number of splits for a single decision unit 106 may vary based on implementation. Furthermore, in some embodiments, the decision units 106 may include multiple incoming signals 108, for example from multiple parallel data buses, and provide either a binary split, a quaternary split, or other split to each incoming signal 108.

As discussed above, the fractal DAC 100 may facilitate decoding of the digital signal 82 (e.g., via the decision units 106) into a thermometric signal dispersed among the unit cells 102. Additionally or alternatively, the digital signal 82 may include a binary signal that is not decoded via the decision units 106. For example, some unit cells 102 may have a binary-sized output that is dependent upon a binary signal. In some embodiments, the binary signal (e.g., a portion of the digital signal 82) may traverse the same path as the decoded thermometric signal and, therefore, have substantially similar arrival time at the binary coded unit cells 102 maintaining synchronicity of the fractal DAC 100. For example, the binary signal may be passed through or bypass the decision units 106 and/or use separate distribution logic following the data path of the fractal DAC 100. The binary coded unit cells 102 use the binary signal to vary the output between zero (e.g., disabled) and a full unit voltage or current (e.g., 0.0, 0.25, 0.5, 0.75, or 1.0 of a unit voltage or current). For example, the binary coded unit cell 102 may include binary interpretation logic to decode the binary signal and enable the binary coded unit cell 102 at an intermediate power level. The binary-sized output of the binary coded unit cells 102 may help increase resolution of the analog output signal 90 by providing increased granularity.

Figure 12:
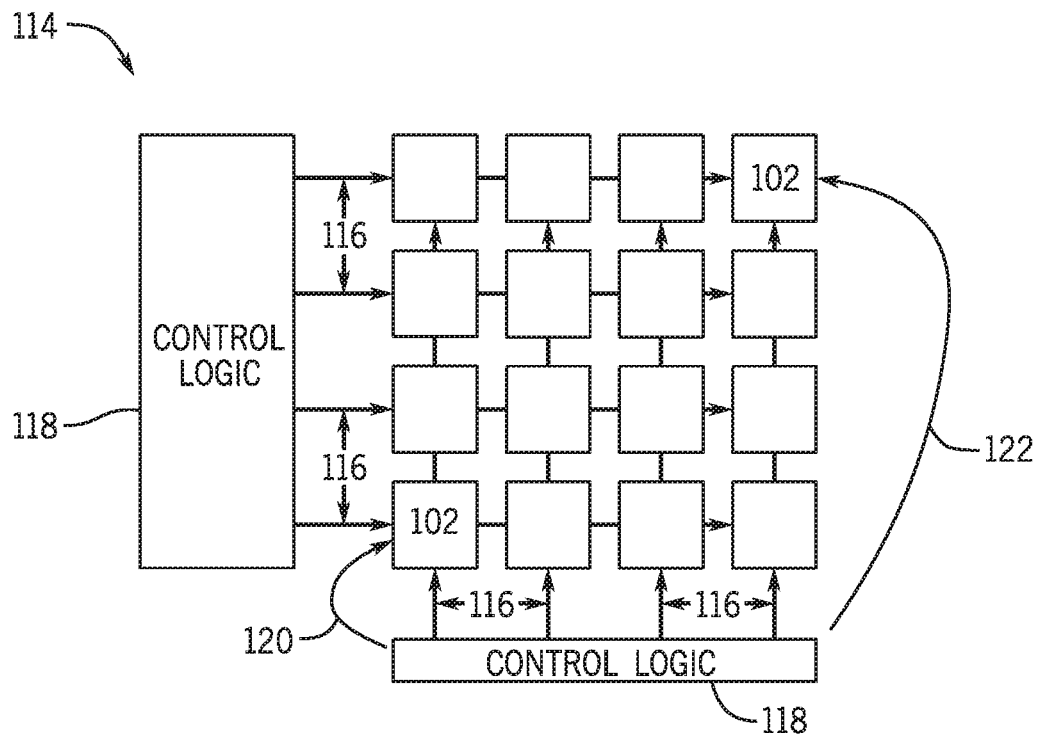
FIG. 12 is a diagrammatic representation of a column and line digital to analog converter, in accordance with an embodiment.

The fractal DAC 100 may provide increased benefits (e.g., increased speed, increased linearity, decreased DNL, and/or decreased INL) over other forms of DACs such as a column and line DAC 114, as shown in FIG. 12. In some scenarios, a column and line DAC 114 may include a multitude of control signals 116 from control logic 118 feeding an array of unit cells 102. Moreover, while the control logic 118 of a column and line DAC 114 may be non-uniform and have more complicated control signals 116, the fractal DAC 100, as discussed herein, may include repeated decision units 106 with simplified outputs (e.g., the MSb signal 110 and the LSb signal 112). For example, the control logic 118 of a column and line DAC 114 may incorporate binary to thermometric conversion and/or take into consideration the desired states of multiple individual unit cells 102 simultaneously to determine what control signals 116 would be needed. On the other hand, the simplified decision units 106 may operate faster than control logic 118 due to the simplified set of inputs and outputs. Furthermore, the linear nature of the data lines and decision units 106 of a fractal DAC 100 may result in fewer errors and/or less effect when errors, such as mistaken logical values, do occur. Additionally, in some embodiments, each decision unit 106 of a fractal DAC 100 may be substantially the same, simplifying manufacturing. Moreover, in some embodiments, one or more decision units 106 may be implemented while minimizing or eliminating gate logic to further increase operating speed.

In some scenarios, the location of the decision units 106 within the array of unit cells 102 may increase the size the array. However, due at least in part to the reduced complexity of the control circuitry (e.g., decision units 106 vs. control logic 118), the internalization of the decision units 106 with the array of unit cells 102 may result in a smaller DAC overall, but reducing or eliminating control logic 118 exterior to the array of unit cells 102.

In addition to providing a simplified manufacturing, simplified operation, decreased size, and/or increased speed of operation, the fractal DAC 100 may include data paths (physically and/or logically) to each unit cell 102 that are substantially the same, which may further increase linearity and/or synchronicity. For example, returning briefly to FIG. 10, starting from the incoming digital signal 82 and the first decision unit 106A, the data path to each unit cell 102 and the number of decision units 106 traversed along the data path is the same for each unit cell 102. As should be appreciated, in some embodiments, some data paths of a fractal DAC 100 may differ due to manufacturing tolerances, physical layout constraints, and/or additional implementation factors.

On the contrary, other DACs, such as the column and line DAC 114 depicted in FIG. 12, may have shorter paths (e.g., data path 120) and longer paths (e.g., data path 122). In some scenarios, the disparate physical lengths and/or disparate logical circuitry traversed in a column and line DAC 114 may result in the column and line DAC 114 waiting until a specified time to allow for the control signals 116 to traverse the longer paths (e.g., data path 122). However, in some embodiments, a fractal DAC 100 may include data paths that are substantially the same, innately providing the decoded incoming signal 108 to each of the unit cells 102 at substantially the same time. In other words, the substantially similar data paths of the fractal DAC 100 may reduce or eliminate a wait time associated with the difference between shorter and longer data paths (e.g., the difference between data path 120 and data path 122) further increasing the operable speed of the fractal DAC 100.

Figure 13:
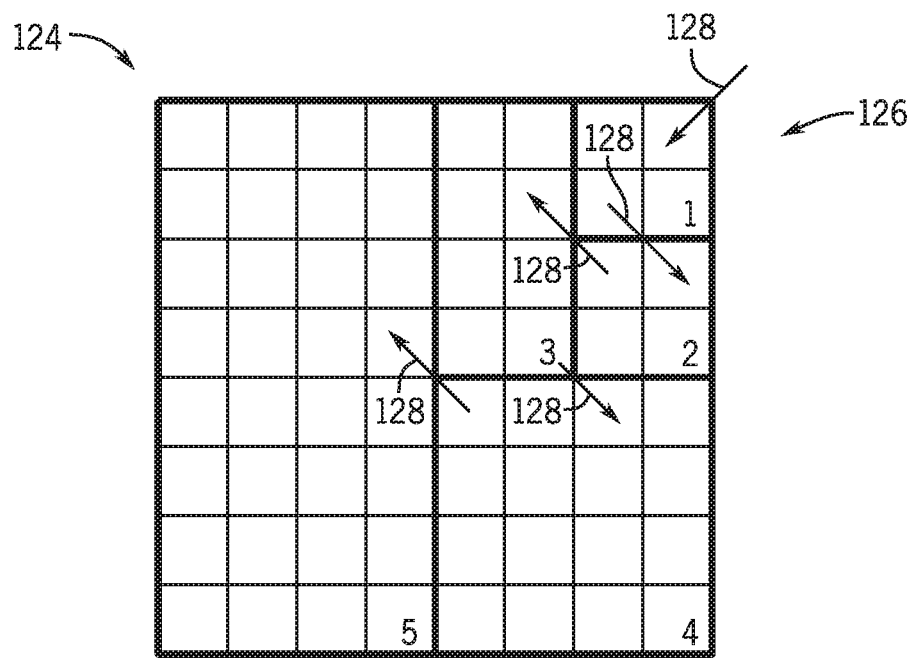
FIG. 13 is a diagrammatic representation of a filling order of a fractal digital to analog converter, in accordance with an embodiment.

As discussed above, the decision units 106 may output an MSb signal 110 and an LSb signal 112 in different directions to different sections of the fractal DAC 100. In some embodiments, the directions of the outputs of the decision units 106 and the unit cells 102 themselves may be organized such that unit step increases in the output of the fractal DAC 100 enable unit cells 102 that are physically adjacent. To help illustrate, FIG. 13 is a unit cell array 124 depicting sequential activation of unit cells 102 in a filling order of the unit cell array 124. As should be appreciated, as used herein, chronological (e.g., before, after, and/or sequential) activation of the unit cells 102 may be considered over multiple cycles of digital signal 82, as for each set of digital signal 82, the unit cells 102 may be enabled/disabled substantially simultaneously due to the substantially similar data paths to each unit cell 102. In some embodiments, the filling order of the unit cell array 124 may begin at a corner 126 and propagate through the unit cell array 124 as depicted by the fill arrows 128. For example, the unit cells 102 of block 1 may be enabled prior to the unit cells 102 of block 2 in response to the digital signal 82 increasing to include more than four unit cells 102. In some embodiments, the filling order may include crossing points at edges of subsequent fractal blocks 104 (e.g., at fill arrow 128 locations).

By sequentially adding (e.g., in response to an increasing digital signal 82) adjacent unit cells 102 to the previously activated unit cells 102, the fractal DAC 100 may exhibit improved linearity (e.g., decreased DNL and/or INL). For example, utilizing immediately adjacent (e.g., directly above, below, to the side, or diagonal to) unit cells 102 in transitioning from a first digital signal 82 to a second digital signal 82 may decrease an impact of process-gradients affecting the individual unit cells 102, which may lead to decreased DNL. As should be appreciated, the filling order illustrated in FIG. 13 is given as an example, and other filling orders may also be used that enable adjacent unit cells 102. Moreover, the depicted filling order may be reversed while still maintaining the adjacency property of added unit cells 102.

Figure 14:
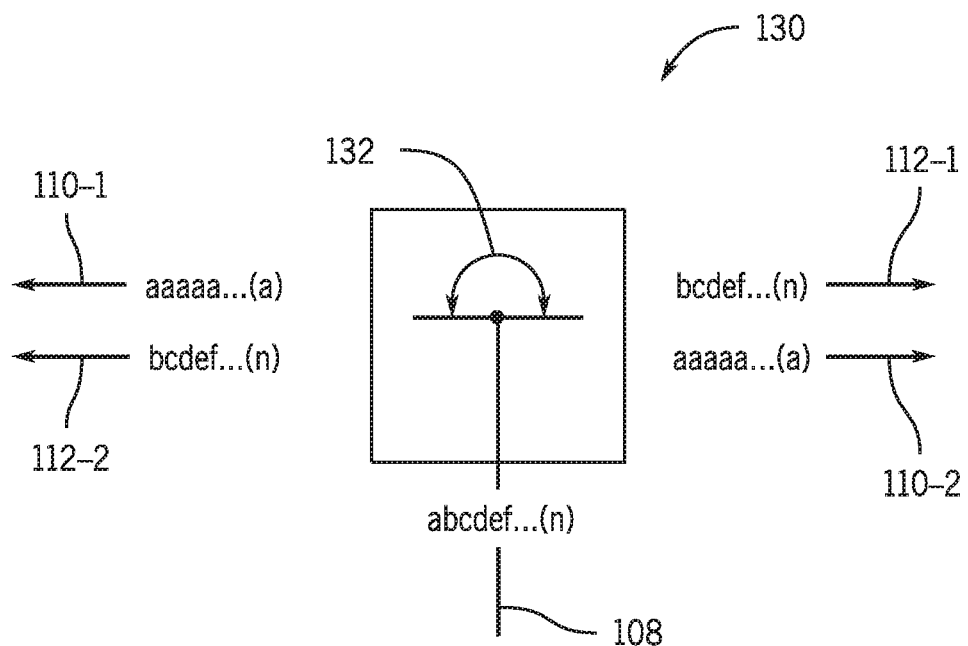
FIG. 14 is a diagrammatic representation of a more specific implementation of the decision unit of FIG. 11, in accordance with an embodiment.

Additionally or alternatively to the filling order, in some embodiments, one or more of the decision units 106 of the fractal DAC 100 may be randomized decision units 130, as shown in FIG. 14. The randomized decision units 130 may randomize, statically or dynamically, which direction (e.g., which branch of the unit cell array 124) each output (e.g., MSb signal 110 and LSb signal 112) will travel. For example, for a given incoming signal 108, the MSb signal 110-1 may go towards a first branch of the unit cell array 124, while the LSb signal 112-1 goes towards a second branch of the unit cell array 124. However, the randomized decision units 130 may include randomizing circuitry 132 such that for a subsequent incoming signal 108, the MSb signal 110-2 may go towards the second branch of the unit cell array 124 and the LSb signal 112-2 may go towards the first branch of the unit cell array 124. Furthermore, in some embodiments, the randomizing circuitry 132 may statically generate a random state for the randomized decision unit 130 or dynamically generate the random state based on the incoming signal and/or an additional signal (e.g., clock signal, phase signal, etc.). The randomization may take place using a pseudorandom number generator, a true random number generator, a predefined table of random values, or any other suitable source of entropy. Randomization of the outputs of the decision units 106 may spread the energy of the noise associated with process-gradients of the unit cells 102 to different frequencies that are negligible and/or do not affect operation of the fractal DAC 100.

Figure 15:
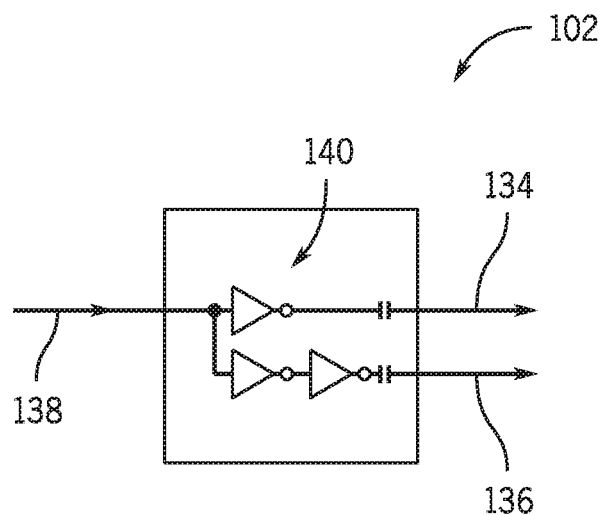
FIG. 15 is a diagrammatic representation of a unit cell of the fractal digital to analog converter of FIG. 10, in accordance with an embodiment.

As discussed above, the unit cells 102 generally receive a portion of the digital signal 82 (e.g., as decoded by the decision units 106) and output a unit voltage or unit current that, in the aggregate, are used to generate the analog output signal 90. As should be appreciated, a unit cell 102 may provide a positive output 134, a negative output 136, or both in response to a decoded signal 138 of the digital signal 82, as depicted in FIG. 15. Furthermore, in some embodiments, the positive output 134 and/or the negative output 136 of the unit cells 102 may traverse a substantially similar path before being aggregated together. For example, the positive output 134 and/or the negative output 136 may traverse the unit cell array 124 of the fractal DAC 100 in the reverse direction of the digital signal 82, traverse a separately pathed fractal layout, or traverse another equal pathed layout such that the positive output 134 and/or the negative output 136 are combined (e.g., summed) synchronously. Additionally, the unit cells 102 may include circuitry components 140 such as resistors, capacitors, inductors, amplifiers, and/or logic circuitry to generate the positive output 134 and negative output 136.

Figure 16:
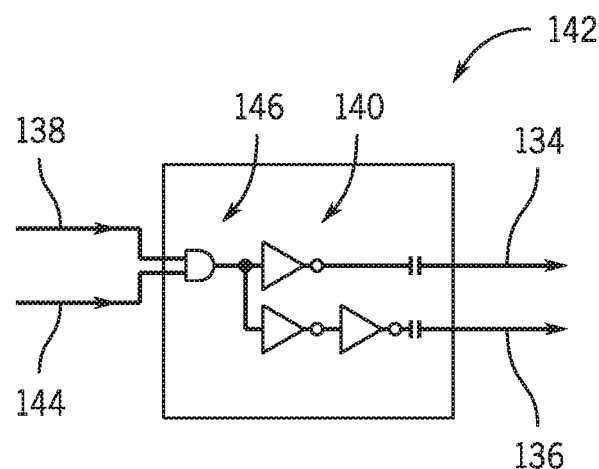
FIG. 16 is a diagrammatic representation of a more specific implementation of the unit cell of FIG. 15, in accordance with an embodiment.

In some embodiments, the unit cells 102 may be clocked unit cells 142 that receive a clock signal 144 in addition to the decoded signal 138, as illustrated in FIG. 16. The clock signal 144 may help improve synchronicity amongst the unit cells 102, for example, by utilizing logic circuitry 146 to gate the decoded signal 138. In some embodiments, the clock signal 144 may propagate through the fractal DAC 100 with the digital signal 82. For example, the clock signal 144 may travel down each branch of the unit cell array 124 and/or through each decision unit 106. By propagating the clock signal 144 through the fractal DAC 100, the clock signal 144 may arrive at each unit cell 102 at substantially the same time, similar to the decoded signal 138. Additionally or alternatively, in embodiments such as where the analog output voltage is to be mixed with a local oscillator frequency (e.g., a carrier frequency), the clock signal 144 may be equal to the local oscillator, so that the clock distribution is serving the double purpose of resynchronization and local oscillator distribution at once. Further, in utilizing a static local oscillator, the fractal DAC 100 may further simply logic circuitry and/or decrease the size of the DAC by reducing or eliminating local oscillator circuitry.

Additionally, in some embodiments, the decision units 106 may utilize the clock signal 144 to resynchronize the incoming signals 108 as they travel down branches of the unit cell array 124. In other words, the clock signal 144 may propagate through the fractal DAC 100 via the branches of the unit cell array 124 with the digital signal 82 and be utilized by decision units 106 to maintain synchronicity of the incoming signals 108 to subsequent decision units 106 and the unit cells 102. Moreover, in some embodiments, resynchronization at the decision units 106 may occur at one or more depths or layers within the unit cell array 124. For example, every one, every other, or every third decision unit 106, following a given branch, may be a clocked decision unit 106 to maintain synchronicity, while other decision units 106 may remain unclocked to reduce power consumption and/or increase speed of operation. Other signals, such as a phase signal, may also be synchronized within the decision units 106. Additionally, in some embodiments, decision units 106 may not propagate the clock signal 144 or other signals (e.g., phase signal) down branches that are known to lead to disabled unit cells 102. For example, if a MSb signal 110 is representative of a particular branch of the unit cell array 124 being disabled, additional signals such as the clock signal 144 may be suspended for the particular branch for potential power savings.

Figure 17:
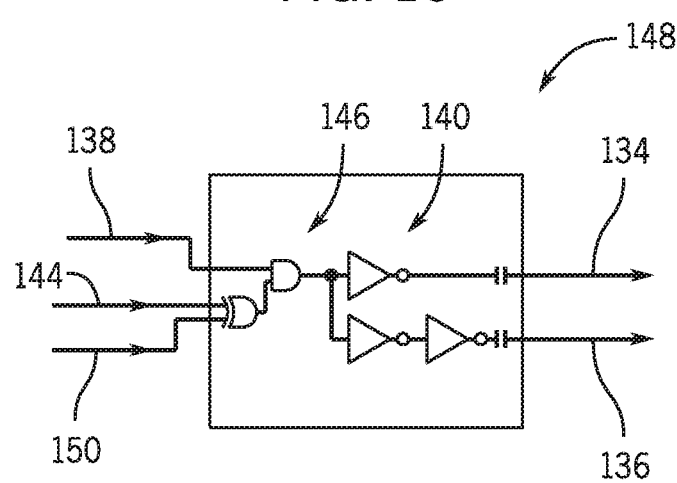
FIG. 17 is a diagrammatic representation of a more specific implementation of the unit cell of FIG. 15, in accordance with an embodiment.

While utilizing clocked or unclocked decision units 106, in some embodiments, the unit cells 102 may be phased unit cells 148 as in FIG. 17. The phased unit cells 148 may handle multiple phases and help reduce the size and/or power consumption of the electronic device 10 by reducing the number of fractal DACs 100 implemented within the electronic device 10. For example, the phased unit cells 148 may receive a phase signal 150 for multiplexing between positive and negative phases. Inverting the phase output may result in unchanged synchronization before and after inversion, maintaining a constant sampling point. Moreover, in-cell phase selection (e.g., utilizing phased unit cells 148) may reduce or eliminate errors, such as mistaken logical values, due to transitions from one phase to another.

Figure 18:
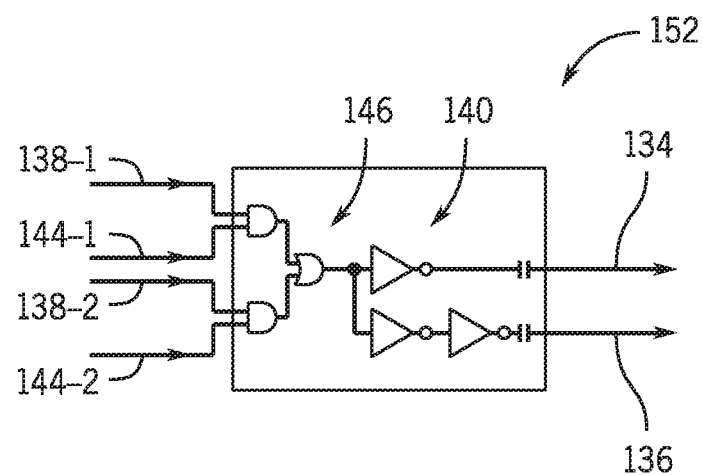
FIG. 18 is a diagrammatic representation of a more specific implementation of the unit cell of FIG. 15, in accordance with an embodiment.

Additionally or alternatively, a unit cell 102 may be a shared phase unit cell 152, such as in FIG. 18. The shared phase unit cell 152 may receive a first phase decoded signal 138-1 and a first phase clock signal 144-1 as well as a second phase decoded signal 138-2 and a second phase clock signal 144-2. Each phase may be controlled separately (e.g., via phase control circuitry). In some embodiments, a filling order may be adapted such that the first phase fills from a first corner (e.g., corner 126) and the second phase fills from an opposite corner. In some embodiments, the filling order and phase control may be organized such a particular shared phase unit cell 152 is not activated by both phases simultaneously, but rather the phases work in unison, filling from their respective corners, to generate the analog output signal 90. As should be appreciated, the decoded signals 138, 138-1, and/or 138-2, clock signals 144, 144-1, and/or 144-2, and/or phase signals 150 may be each traverse the unit cell array 124 of the fractal DAC 100, such that they arrive at their corresponding unit cells 102 at substantially the same time.

Figure 19:
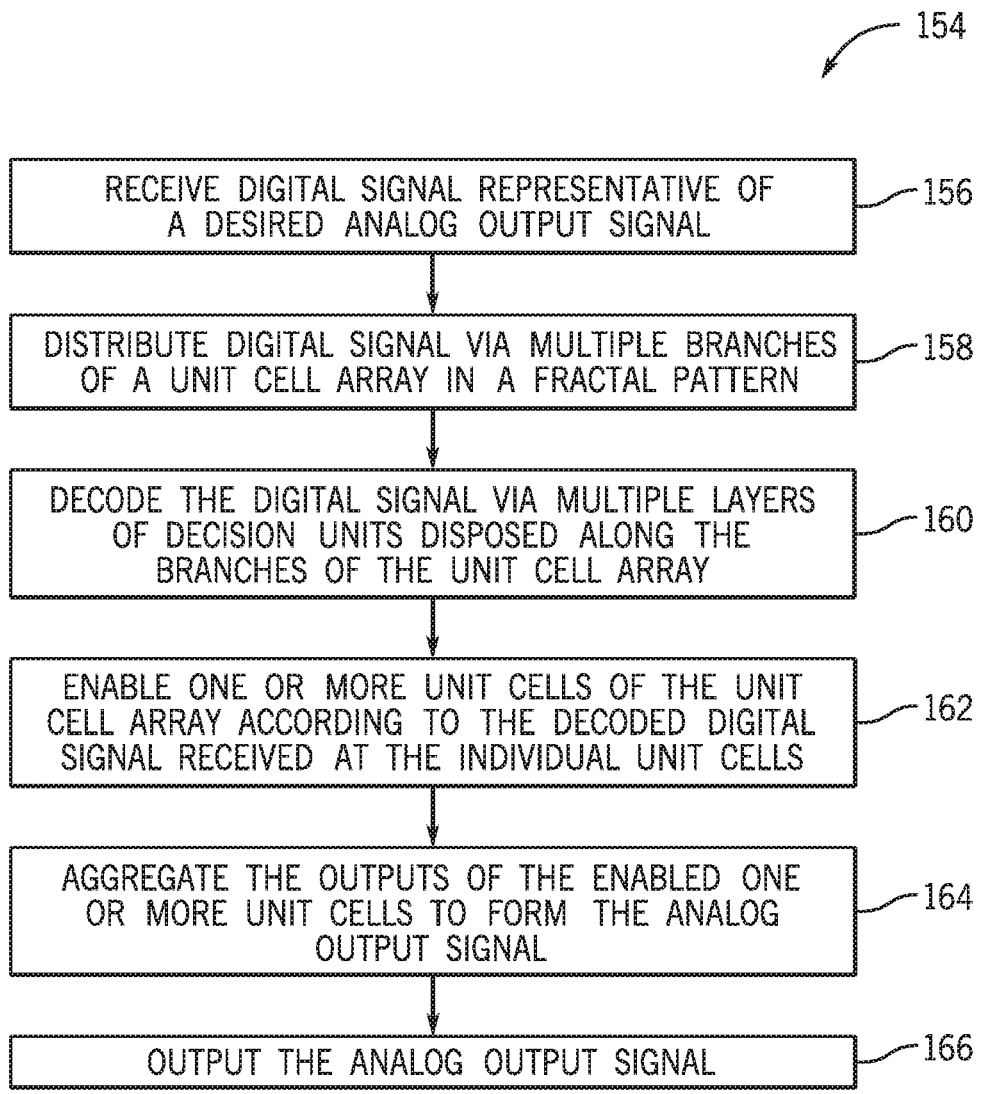
FIG. 19 is a flowchart of an example process for operation of a fractal digital to analog converter, in accordance with an embodiment.

As discussed above, the fractal DAC 100 may provide increased simplicity and speed of operation in converting a digital signal 82 into an analog output signal 90. FIG. 19 is a flowchart 154 of an example process for generating the analog output signal 90. The fractal DAC 100 may receive a digital signal 82 representative of a desired analog output signal 90 (process block 156). The digital signal 82 may be distributed (e.g., to individual unit cells 102) via multiple branches of a unit cell array 124 in a fractal pattern (process block 158). For example, the physical layout of the data path and unit cell array 124 may be composed of fractal blocks 104 repeated amongst multiple layers of the unit cell array 124. The digital signal 82 may be decoded by multiple layers of decision units 106 disposed along the branches of the unit cell array 124 (process block 160). For example, the decision units 106 may decode the digital signal 82 into multiple decoded signals 138, each going to a respective unit cell 102. Further, in some embodiments, the aggregate of the multiple decoded signals 138 may form a thermometric code, where each bit of the thermometric code is distributed to a respective unit cell 102. One or more unit cells 102 of the unit cell array 124 may be enabled according to the decoded digital signal 82 (e.g., decoded signals 138) received at the individual unit cells 102 (process block 162). The enabled unit cells 102 may each output a unit level voltage or current, and the outputs (e.g., respective positive outputs 134 and/or respective negative outputs 136) may be aggregated to form the analog output signal 90 (process block 164). Once the analog output signal 90 has been generated, the fractal DAC 100 may output the analog output signal 90 (process block 166).

Although the above referenced flowcharts 92 and 154 are shown in a given order, in certain embodiments, process blocks may be reordered, altered, deleted, and/or occur simultaneously. Additionally, the referenced flowcharts 92 and 154 are given as illustrative tools and further decision and process blocks may also be added depending on implementation.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An electronic device comprising:
   digital circuitry configured to operate via digital signals;
   analog circuitry configured to operate via analog signals; and
   a fractal digital to analog converter (DAC) configured to convert a digital signal of the digital signals into an analog signal of the analog signals, wherein the fractal DAC comprises:
      a unit cell array comprising a branching data path and a plurality of unit cells disposed in a fractal pattern, wherein the branching data path branches recursively according to the fractal pattern; and
      a plurality of decision unit circuits disposed within the unit cell array on the branching data path, wherein each decision unit circuit of the plurality of decision unit circuits is configured to:
         receive an incoming signal representative of at least a portion of the digital signal; and
         direct each decision unit circuit output of a plurality of decision unit circuit outputs to different branches of the unit cell array, wherein one or more unit cells of the plurality of unit cells are enabled based at least in part on the plurality of decision unit circuit outputs to generate the analog signal, wherein the analog signal comprises an aggregate of outputs of the one or more unit cells.

2. The electronic device of claim 1, wherein the outputs of the one or more unit cells comprise respective predetermined voltages, wherein the analog signal comprises an aggregate of the respective predetermined voltages of the one or more unit cells.

3. The electronic device of claim 1, wherein the branching data path bifurcates at each decision unit circuit of the plurality of decision unit circuits.

4. The electronic device of claim 1, wherein the fractal pattern of the plurality of unit cells, the branching data path, and the plurality of decision unit circuits is symmetric about a central axis.

5. The electronic device of claim 1, wherein each decision unit circuit of the plurality of decision unit circuits is configured to decode the incoming signal by separating a most significant bit of the incoming signal and a remainder of the incoming signal, wherein the remainder comprises one or more least significant bits of the incoming signal.

6. The electronic device of claim 5, wherein the plurality of decision unit circuit outputs comprises a most significant bit output and a least significant bit output, wherein the most significant bit output comprises the most significant bit of the incoming signal repeated a first number of times, wherein the least significant bit output comprises the remainder, wherein the incoming signal comprises a second number of bits, wherein the second number of bits is greater than the first number of bits.

7. The electronic device of claim 1, wherein each decision unit circuit is configured to randomize to which of the different branches each decision unit circuit output of the plurality of decision unit circuit outputs is directed.

8. The electronic device of claim 1, wherein the digital signal comprises a first digital signal, wherein subsequently converting a second digital signal, representative of a greater analog signal than the first digital signal, directly after the first digital signal is converted comprises enabling a previously disabled unit cell physically adjacent to a previously enabled unit cell.

9. The electronic device of claim 1, wherein the branched data path comprises a plurality of individual data paths to each of the plurality of unit cells, wherein each individual data path of the plurality of individual data paths is substantially similar in length.

10. The electronic device of claim 1, wherein the branching data path comprises a plurality of data buses configured to convey a plurality of the digital signals to the plurality of decision unit circuits, wherein the plurality of the digital signals comprises the digital signal and one or more clock signals.

11. The electronic device of claim 1, wherein the branching data path of the unit cell array is configured to direct the plurality of decision unit circuit outputs to the plurality of unit cells such that a unit increase of the digital signal enables a single additional unit cell of the plurality of unit cells, wherein the single additional unit cell of the plurality of unit cells is immediately adjacent a previously enabled unit cell of the plurality of unit cells.

12. A digital to analog converter (DAC) comprising:
    a unit cell array comprising a branching data path and a plurality of unit cells disposed in a fractal pattern, wherein the branching data path branches recursively according to the fractal pattern; and a plurality of decision unit circuits disposed within the unit cell array on the branching data path, wherein each decision unit circuit of the plurality of decision unit circuits is configured to:

receive an incoming signal representative of at least a portion of a digital signal; and direct each decision unit circuit output of a plurality of decision unit circuit outputs to different branches of the unit cell array, wherein one or more unit cells of the plurality of unit cells are enabled based at least in part on the plurality of decision unit circuit outputs to generate an analog signal corresponding to the digital signal, wherein the analog signal comprises an aggregate of outputs of the one or more unit cells.

13. The DAC of claim 12, wherein a first data path of the branched data path to a first unit cell comprises a first path length and a first number of decision unit circuits traversed, wherein a second data path of the branched data path to a second unit cell comprises a second path length and a second number of decision unit circuits traversed, wherein the first path length and the second path length are substantially equal, wherein the first number of decision unit circuits traversed is equal to the second number of decision unit circuits traversed.

14. The DAC of claim 12, wherein the branched data path comprises a plurality of layers, wherein each subsequent layer of the plurality of layers comprises two or four times as many branches as each previous layer of the plurality of layers, wherein each branch of the branched data path is split via a respective decision unit circuit at each layer of the plurality of layers.

15. The DAC of claim 14, wherein respective incoming signals to the respective decision unit circuits are synchronized, via the respective decision unit circuits, at one or more layers of the plurality of layers according to a clock signal received by the respective decision unit circuits.

16. The DAC of claim 12, wherein each unit cell of the plurality of unit cells is latched according to a clock signal.

17. The DAC of claim 16, wherein the clock signal comprises a local oscillator frequency, wherein the analog signal is output having a carrier frequency equal to the local oscillator frequency of the clock signal.

18. The DAC of claim 12, wherein each unit cell of the plurality of unit cells is configured to receive a phase signal, wherein a unit cell of the plurality of unit cells is configured to selectively multiplex between a positive output of the unit cell and a negative output of the unit cell based at least in part on the phase signal.

19. A method comprising:

receiving, via a fractal digital to analog converter (DAC), a digital signal representative of an analog signal;

distributing the digital signal via a plurality of branches of a branching data path of a unit cell array of the fractal DAC in a fractal pattern, wherein the fractal pattern comprises symmetrically repeating fractal blocks that recursively branch the branching data path, wherein each fractal block comprises:

a decision unit circuit configured to decode at least a portion of the digital signal;

a data path split by the decision unit circuit, wherein the data path of each fractal block comprises a portion of the branching data path; and a plurality of unit cells, wherein each unit cell of the plurality of unit cells are electrically coupled to respective portions of the split data path and are configured to output a unitary power;

enabling one or more unit cells of the unit cell array based at least in part on the digital signal decoded by a plurality of decision unit circuits; and outputting the analog signal, wherein the analog signal comprises an aggregate of each unitary power of the enabled one or more unit cells.

20. The method of claim 19, comprising decoding, via the plurality of decision unit circuits, the digital signal, wherein decoding the digital signal comprises converting the digital signal in a binary format to a thermometric format, such that each unit cell of the unit cell array receives a single bit of the digital signal in the thermometric format.

21. The method of claim 19, wherein each decision unit circuit of the plurality of decision unit circuits is configured to split the data path by:

receiving an incoming signal comprising at least a portion of the digital signal;

outputting a first output, to a first branch of the plurality of branches, corresponding to a most significant bit of the incoming signal; and outputting a second output, to a second branch of the plurality of branches, corresponding to one or more least significant bits of the incoming signal.

22. The method of claim 19, wherein the fractal pattern is configured to propagate by replacing each unit cell of the plurality of unit cells with a fractal block.

23. The method of claim 19, wherein each unitary power of the enabled one or more unit cells traverses respective paths of substantially similar length during aggregation to form the analog signal.

24. The method of claim 19, wherein enabling the one or more unit cells of the unit cell array based at least in part on the digital signal decoded by the plurality of decision unit circuits comprises enabling the one or more unit cells according to a filling order of the unit cell array such that a unit increase of the digital signal enables a single additional unit cell of the plurality of unit cells immediately adjacent a previously enabled unit cell of the plurality of unit cells.

25. The method of claim 19, comprising:

receiving a binary signal comprising at least a second portion of the digital signal;

enabling a binary coded unit cell to output an intermediate power less than the unitary power based on the binary signal; and outputting the analog signal, wherein the analog signal comprises an aggregate of each unitary power of the enabled one or more unit cells and the intermediate power.

* * * * *